(12) United States Patent
Abhishek et al.

(10) Patent No.: US 10,418,952 B1
(45) Date of Patent: Sep. 17, 2019

(54) AMPLIFIER WITH HYSTERESIS

(71) Applicant: NXP USA, INC., Austin, TX (US)

(72) Inventors: Kumar Abhishek, Austin, TX (US); Srikanth Jagannathan, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/920,743

(22) Filed: Mar. 14, 2018

(51) Int. Cl.
  *H03F 3/45* (2006.01)
  *H03F 1/02* (2006.01)
  *H03K 5/22* (2006.01)
  *H03K 5/24* (2006.01)

(52) U.S. Cl.
  CPC ....... *H03F 3/45179* (2013.01); *H03F 1/0216* (2013.01); *H03F 2200/384* (2013.01); *H03F 2203/45024* (2013.01); *H03F 2203/45054* (2013.01); *H03F 2203/45242* (2013.01); *H03F 2203/45511* (2013.01); *H03F 2203/45592* (2013.01); *H03F 2203/45664* (2013.01)

(58) Field of Classification Search
  USPC .................................................. 330/252–261
  See application file for complete search history.

(56) References Cited

U.S. PATENT DOCUMENTS 7,973,569 B1 7/2011 Bashar
8,558,581 B2 10/2013 Prohaska et al.
9,654,091 B2 * 5/2017 Wu ....................... H03K 5/2481

OTHER PUBLICATIONS

Kulkarni, V., "Low-Voltage CMOS Comparators With Programmable Hysteresis", Thomas & Brown, Oct. 10, 2005.
Song, B.G., "A 1.8V Self-Biased Complementary Folded Cascode Amplifier", AP-ASIC 99, IEEE 1999.

* cited by examiner

*Primary Examiner* — Hieu P Nguyen
(74) *Attorney, Agent, or Firm* — David G. Dolezal

(57) ABSTRACT

An amplifier includes a differential input stage, a hysteresis stage, coupled to the differential input stage, a cascode stage coupled to the hysteresis stage, a feedback stage coupled to an output of the cascode stage and configured to provide a feedback signal to the hysteresis stage, and an output stage coupled to the output of the cascode stage. The output stage includes a hysteresis inverter coupled between the output of the cascode stage and the amplifier output.

19 Claims, 4 Drawing Sheets

US 10,418,952 B1

AMPLIFIER WITH HYSTERESIS

BACKGROUND OF THE INVENTION

Field of the Invention

This invention relates in general amplifiers with hysteresis.

Background

Some amplifiers such as operational amplifiers include two inputs: an inverting input (−) and a non-inverting input (+). The polarity of the output is based on the voltage differential between the inverting input and the non-inverting input.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, an amplifier includes a differential input stage, a hysteresis stage, a cascode stage, a feedback stage, and a hysteresis inverter for providing an output of the amplifier. In one embodiment, the feed back stage provides a feedback signal based on the output of the cascode stage. The hysteresis stage provides hysteresis to the output of the cascode stage. In one embodiment, the hysteresis inverter is configured so that a non-linearity in the voltage response of the cascode output introduced by the hysteris stage is between the voltage threshold switch points of the hysteresis inverter to inhibit the output from changing states due to the non-linearity.

Figure 1:
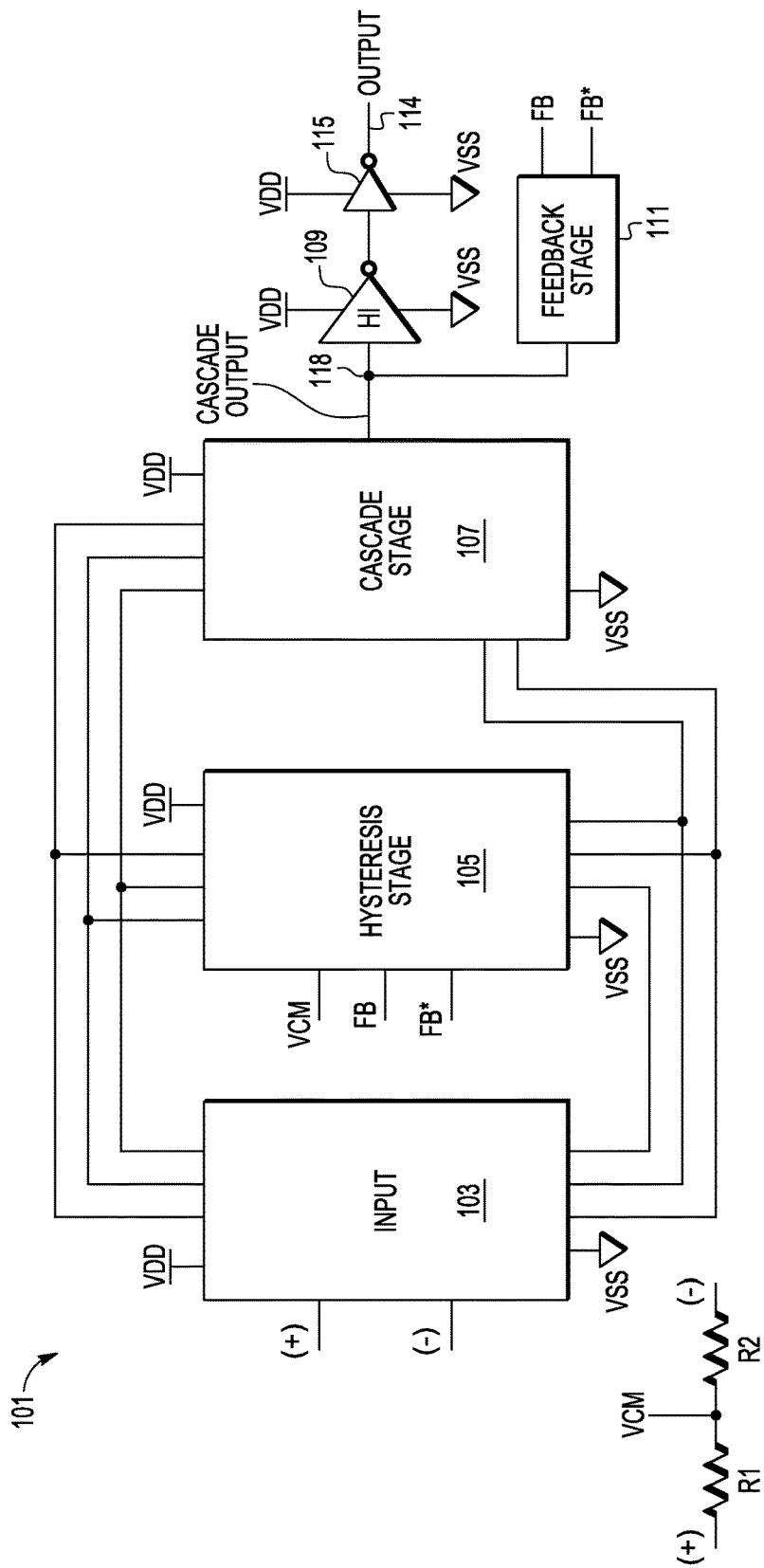
FIG. 1 is a block diagram of an amplifier according to one embodiment of the present invention.

FIG. 1 is a block diagram of an amplifier according to one embodiment of the present invention. Amplifier 101 includes a differential input stage having an inverting input (−) and a non-inverting input (+). Amplifier 101 includes an output 114 at the output of inventor 115. In one embodiment, the voltage state of output 114 is dependent upon which of the inputs (−) (+) has a higher voltage.

Amplifier 101 includes a hysteresis stage 105 and a cascode stage 107. The output 118 of cascode stage 107 is provided to a feedback stage 111. Feedback stage 111 provides feedback signals FB and FB* to hysteresis stage 105 to provide the cascode stage output 118 with hysteresis so as to keep cascode output 118 from toggling between states when the differential voltage is within the hysteresis margin. In one embodiment, the voltages of the inputs vary from VDD (e.g. 1.8 Volts) to VSS (0 Volts) wherein the amount of hysteresis provided by hysteresis stage 105 is 10% of the maximum voltage differential between the inputs. However, in other embodiments, the inputs (+) (−) may swing between two different voltage levels, and the hysteresis margin provided by hysteresis stage 105 may be of other values.

Figure 2:
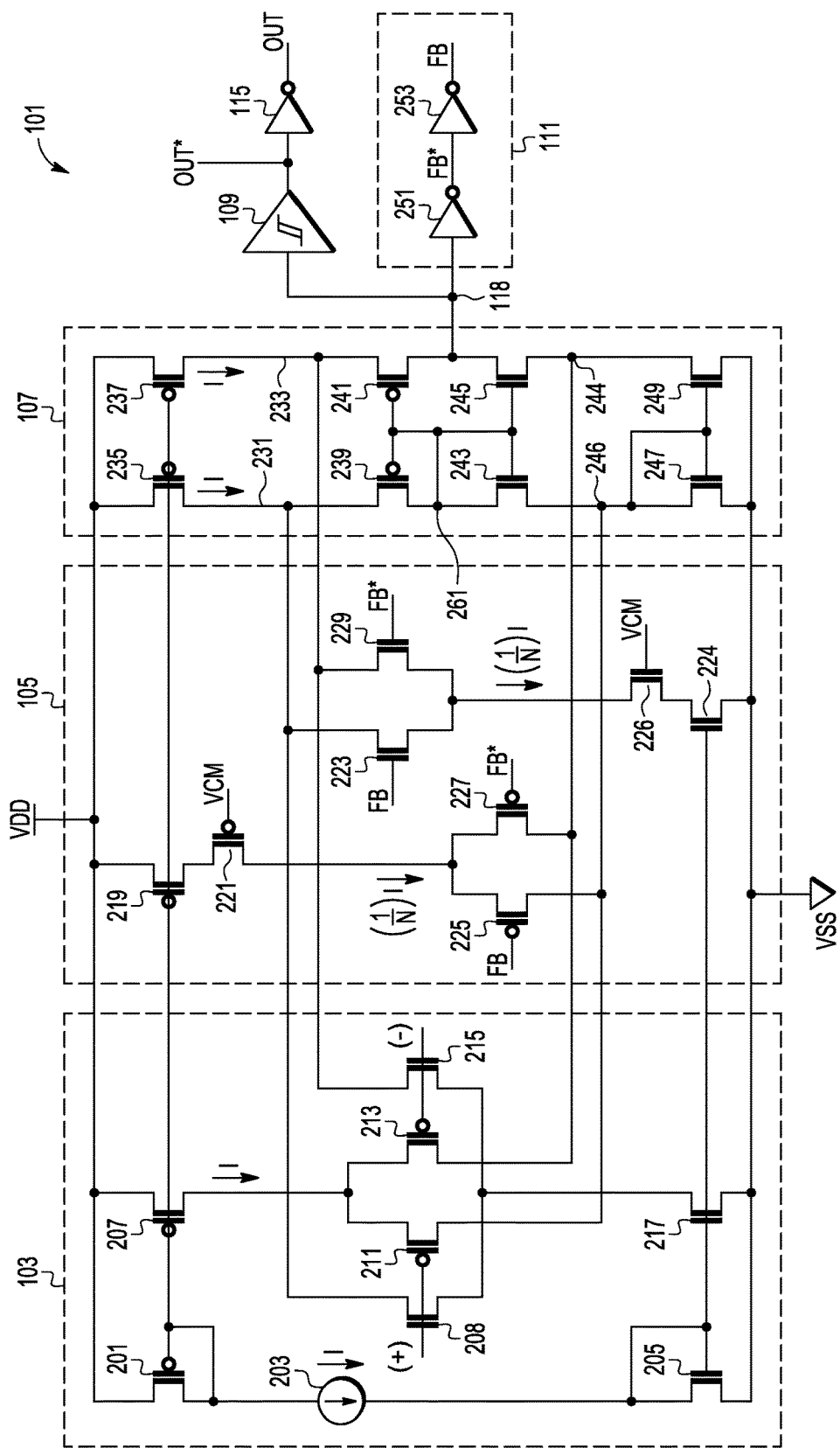
FIG. 2 is a circuit diagram of an amplifier according to one embodiment of the present invention.
Figure 3:
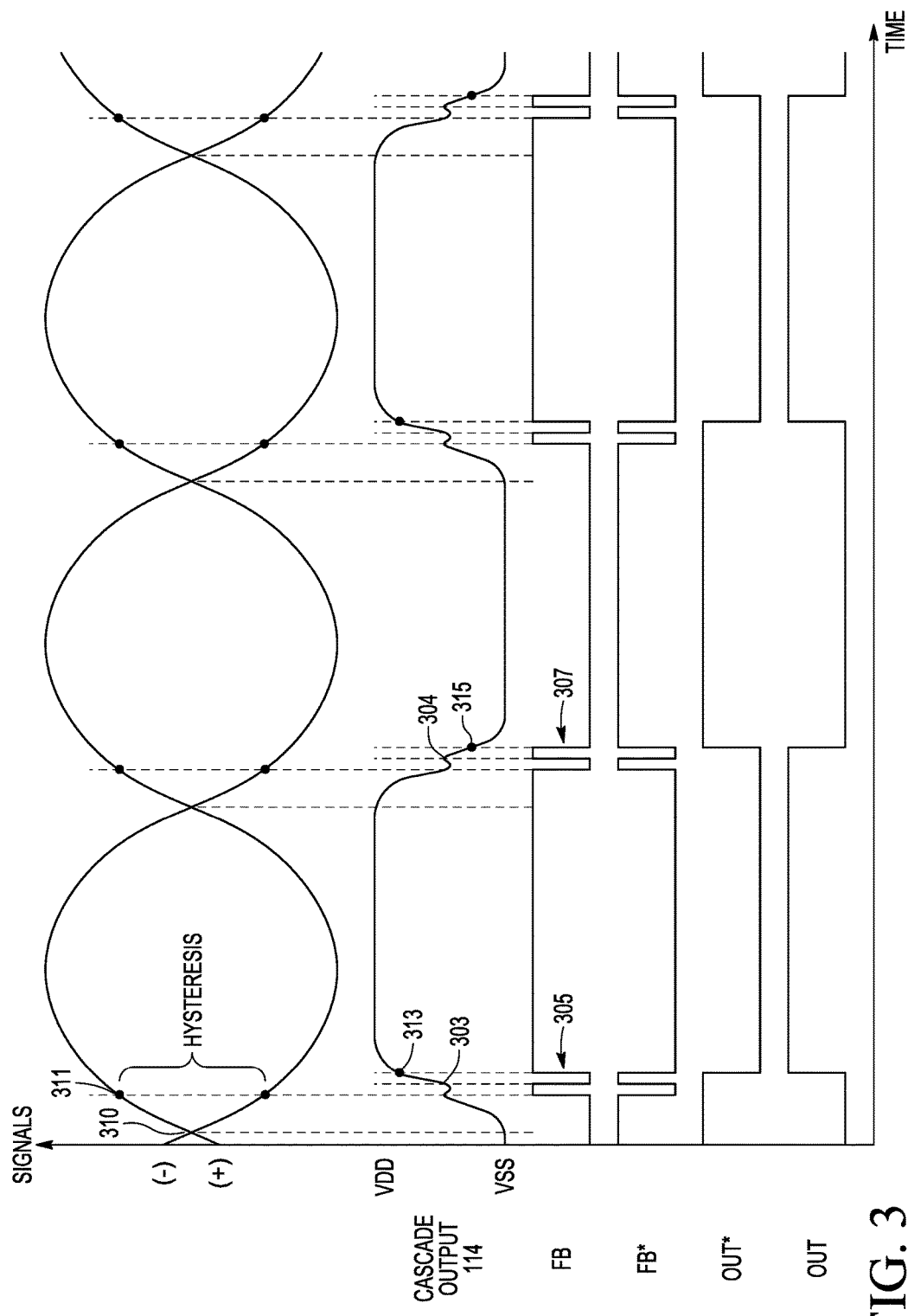
FIG. 3 is a timing diagram showing the operation of an amplifier according to one embodiment of the present invention.

In some embodiment, hysteresis stage 105 introduces a non-linearity in the voltage response of the cascode output 118 (see non-linearities 303 and 304 in FIG. 3). In certain situations, these nonlinearities may cause a subsequent inverter (e.g. inverter 251 in FIG. 2) receiving the cascode output to undesirably change states at the non-linearity points.

Amplifier 101 includes a hysteresis inverter 109 that receives the cascode output signal from output 118. Hysteresis inverter 109 includes a voltage threshold switching point for a rising voltage at its input and a different voltage threshold switching point for a falling voltage at its input. A voltage threshold switching point of an inverter is a voltage at the input of an inverter in which the output changes voltage states. In one embodiment, the non-linearities caused by the hysteresis stage 105 in the voltage response of output 118 are between the two voltage threshold switching points of the hysteresis invertor 109.

In the embodiment shown, amplifier 101 also includes a common mode circuit 113 for generating a common mode signal (VCM) from the signals provided to the inverting input and the non-inverting input. In the embodiment shown, R1 and R2 have the same resistance value. Other types of common mode circuits maybe utilized to generate a common mode signal in other embodiments.

In one embodiment, amplifier 101 is used in a serial data communication circuit, but may be used in other types of circuits in other embodiments. In one embodiment, amplifier 101 is an operational amplifier, but may be another type of amplifier in other embodiments.

FIG. 2 is a circuit diagram of amplifier 101 according to one embodiment of the present invention. Differential input stage 103 includes an inverting input (−) and a non-inverting input (+). Stage 103 also includes current source 203 for establishing a current (I) in amplifier 101. In the embodiment shown, input stage 103 includes two differential pairs of transistors, a P-type differential pair of transistors 211 and 213 and an N-type differential pair of transistors 208 and 215. One transistor of each differential pair includes a gate connected to the inverting input and the other transistor of each differential pair includes a gate connected to the non-inverting input. Current I from current source 203 is mirrored by the current mirror of transistors 201 and 207 to be provided to the P-type differential pair of transistors 211 and 213. Current from the current source 203 in mirrored by the current mirror of transistor 205 and 217 and provided to the N-type transistor pair of transistors 208 and 215.

Cascode stage 107 includes two current paths, current path 231 and current path 233. Current path 231 includes transistor 235, 239, 243, and 247 as well as node 246. Current path 233 includes transistors 237, 241, 245, and 249 as well as cascode output 118 and node 244. Transistor 235 forms a current mirror with transistor 201 to mirror the current I of current source 203 in path 231. Transistor 237 forms a current mirror with transistor 201 to mirror the current I of current source 203 in path 233.

The drain of transistor 208 is connected to a node of current path 231 and the drain of transistor 215 is connected to a node of current path 233. The drain of transistor 211 is connected to a node 246 of path 231 and the drain of transistor 213 is connected to a node 244 of path 233.

Stage 107 is characterized as a cascode stage in that it includes a common control electrode topology (including transistors 239, 241, 243, and 245 in the embodiment shown) to provide the output signal at output 118 wherein the common control electrode topology receives current from the amplifying circuitry of input stage 103 and transistors 235, 237, 247 and 249 in the embodiment shown. In the embodiment shown, stage 107 is a folded, self-biasing cascode stage in that the gates of transistors 239, 241, 243, and 245 are connected together at node 261 of current path 231. In other embodiments, cascode stage 107 may have other configurations including other common control electrode topologies and/or be of other types of cascode stages. For example, in some embodiments, the gates of transistors 239, 241, 243, and 245 maybe biased at nodes of a resistance ladder coupled to a fixed referenced source (not shown) so as to provide better conductivity of those transistors at input voltages closer to the power supply voltages. In other embodiments, the gates transistors 239, 241, 243, and 245 maybe biased by other fixed biased sources (e.g. band gap reference, buffer output). In still other embodiments, some of the transistors of the common control electrode topology (e.g. 239, 241) may be biased with a fixed source, and other transistors (243, 245) would be self biasing. In other embodiments, cascode stage may be a simple cascode stage, a telescopic cascode stage, or a gain boosted cascode stage. In other embodiments, a common control electrode topology may include a different number of transistors.

During the operation of amplifier 101, the current of current source 203 is mirrored in paths 231 and 233 by transistors 235 and 237, respectively. Depending upon whether the non-inverting input (+) or the inventing input (−) is higher in voltage, transistor 208 or transistor 215 will be more conductive. If transistor 208 is more conductive due to its input voltage being higher, more current from current path 231 will be diverted to transistor 208 than will be diverted from path 233 to transistor 215. More current being diverted from current path 231 reduces the current flow to transistors 239, 243, and 247. Because transistors 247 and 249 form a current mirror, the reduction in current through transistor 247 reduces the current trough transistor 249 as well as through transistor 245. In such a condition, the current through transistors 237 and 241 will be higher than the current through transistors 245 and 249 to pull the cascode output 118 to a high voltage value near VDD.

If the voltage of the inverting input (−) is higher than the voltage of the non-inverting input (+), then transistor 215 is more conductive than transistor 208, which diverts more current from current path 233 to transistor 215 than is diverted from current path 231 to transistor 208. Accordingly, the current through transistor 241 will be reduced. The higher current through transistors 239, 243, and 247 will cause the current through transistors 249 and 245 to be greater than the current through transistor 241, thereby pulling cascode output 118 towards VSS.

Regarding the operation of the P-type differential pair of transistors 211 and 213, if the voltage of the non-inverting input (+) is higher than the voltage of the inverting input (−), transistor 213 will be more conductive than transistor 211. Transistor 213 being more conductive provides more of current I to transistor 249 at node 244 than transistor 211 provides to transistor 247 at node 246. However, because the conductivity of transistor 249 is controlled by node 246, the increase in current provided to transistor 249 increases the voltage of node 244. Increasing the voltage at node 244 lowers the $V_{GS}$ voltage of transistor 245 which reduces the current flowing through transistor 245 and increases the voltage at cascode output 118 due to more current flowing through transistors 237 and 241 than transistor 245.

If the voltage of the inverting input (−) is higher than the voltage of the non-inverting input (+), transistor 211 will be more conductive than transistor 213. Transistor 211 being more conductive provides more of current I to transistor 247 at node 246 than transistor 213 provides to transistor 247. Because transistors 247 and 249 form a current mirror, the increase in current through transistor 247 also increases the current through transistors 249 and 245. Since the current through transistor 245 is greater than the current through transistor 241, the voltage of output 118 is pulled towards VSS.

In embodiment of FIG. 2, differential input stage 103 includes both a P-type differential pair of transistors 211 and 213 for operating at lower common mode voltages and an N-type differential pair of transistors 208 and 215 for operating at higher common mode voltages. Thus, the embodiment shown in FIG. 2 can operate over a wider range of common mode voltages. Both pairs of transistors share a common reference current (I) from current source 203. The cascode stage 107 implements a push-pull circuit to generate the desired output voltage at output 118 by push/pulling current through the two differential pairs of transistors based upon the voltages of the inputs (+) and (−). However, in other embodiments, an input stage may only have a P-type different pair of transistors or an N-type differential pair of transistors. In other embodiments, cascode stage 107 may have other configurations depending upon whether input stage 103 has an N-type differential pair or a P-type differential pair.

In the embodiment shown, hysteresis stage 105 uses a positive feedback configuration to boost the current that is pushed/pulled in the cascade stage 107 to provide hysteresis for output 118 of the cascade stage 107. The additional boost current provided by hysteresis stage 105 must be overcome by the change in voltage values of the inputs (+) (−) prior to the output 118 changing voltage states.

Hysteresis stage 105 includes a differential pair of P-type transistors 225 and 227 and a differential pair of N-type transistors 223 and 229. Each differential pair includes one transistor whose gate is controlled by feedback signal FB from feedback stage 111 and a second transistor whose gate is controlled by feedback signal FB* from feedback stage 111. Feedback stage 111 includes an inverter 251 whose input is connected to output 118 and whose output provides feedback signal FB*. Feedback stage 111 also includes inverter 253 whose output provides feedback signal FB.

Hysteresis stage 105 includes transistor 219 which forms a current mirror with transistor 201 to provide current to P-type differential pair of transistors 225 and 227 from supply terminal VDD. In the embodiment shown, transistor 219 is sized to allow a fraction (1/N) of the current (I) of current source 203. Stage 105 also includes a transistor 224 that forms a current mirror with transistor 205 to pull current from the N-type differential pair of transistors 223 and 229. In the embodiment shown, transistor 224 is sized to allow a fraction (1/N) of the current I that is allowed by transistor 205 to be pulled to supply terminal VSS.

The differential pair of N-type transistors 223 and 229 of hysteresis stage 105 works as follows. In a steady state condition when the non-inverting input is at a higher voltage than the inverting input, output 118 and signal FB will be at a high voltage state and signal FB* will be at a low voltage state. In such a condition, transistor 223 is conductive and transistor 229 is not conductive. With transistor 223 being conductive, additional current will be pulled from path 231 through transistor 223 which is additive to the current being pulled from path 231 through transistor 208. If the voltage differential between the inverting input and the non-inverting input changes to where the voltage of the inverting input becomes higher than the voltage of the non-inverting input, the voltage differential of the inputs will have to exceed a voltage value where the current flowing through transistor 215 is greater than the current flowing through both transistor 208 and transistor 223 before output 118 switches to a low voltage state. This differential voltage value is a voltage threshold switching point for output 118 for a voltage differential transition from the non-inverting input voltage being higher to the inverting input voltage being higher.

Once output 118 switches voltage states, the FB* signal goes high and the FB signal goes low indicating that the inverting input is at a higher voltage than the non-inverting input. At such a condition, transistor 229 become conductive and transistor 223 is not conductive. With transistor 229 being conductive, additional current will be pulled from path 233 through transistor 229 which is additive to the current being pulled from path 233 through transistor 215. If the voltage differential between the inverting input and the non-inverting input changes to where the voltage of the non-inverting input becomes higher than the voltage of the inverting input, the voltage differential between the inputs will have to exceed a voltage value where the current flowing through transistor 208 is greater than the current flowing through both transistor 215 and transistor 229 before output 118 switches to a high voltage state. This differential voltage value is a voltage threshold switching point for output 118 for a voltage differential transition from the inverting input voltage being higher to the non-inverting input voltage being higher. Once output 118 switches voltage states, the FB* signal goes low and the FB signal goes high indicating that the non-inverting input is at a higher voltage than the inverting input. At such a condition, transistor 223 become conductive and transistor 229 is not conductive.

The differential pair of P-type transistors 225 and 227 of hysteresis stage 105 works as follows. In a steady state condition when the non-inverting input is at a higher voltage than the inverting input, output 118 and signal FB will be at a high voltage state and signal FB* will be at a low voltage state. In such a condition, transistor 227 is conductive and transistor 225 is not conductive. With transistor 227 being conductive, additional current will be provided to node 244 through transistor 227 which is additive to the current being provided to node 244 through transistor 213. If the voltage differential between the inverting input and the non-inverting input changes to where the voltage of the inverting input becomes higher than the voltage of the non-inverting input, the voltage differential of the inputs will have to exceed a voltage value where the current flowing through transistor 211 is greater than the current flowing through both transistor 213 and transistor 227 before output 118 switches to a low voltage state. This differential voltage value is a voltage threshold switching point for output 118 for a voltage differential transition from the non-inverting input voltage being higher to the inverting input voltage being higher.

Once output 118 switches voltage states, the FB* signal goes high and the FB signal goes low indicating that the inverting input is at a higher voltage than the non-inverting input. At such a condition, transistor 225 become conductive and transistor 227 is not conductive. With transistor 225 being conductive, additional current is provided to node 246 through transistor 225 which is additive to the current being provided to node 246 through transistor 211. If the voltage differential between the inverting input and the non-inverting input changes to where the voltage of the non-inverting input becomes higher than the voltage of the inverting input, the voltage differential between the inputs will have to exceed a voltage value where the current flowing through transistor 213 is greater than the current flowing through both transistor 211 and transistor 225 before output 118 switches to a high voltage state. This differential voltage value is a voltage threshold switching point for output 118 for a voltage differential transition from the inverting input voltage being higher to the non-inverting input voltage being higher. Once output 118 switches voltage states, the FB* signal goes low and the FB signal goes high indicating that the non-inverting input is at a higher voltage than the inverting input. At such a condition, transistor 227 become conductive and transistor 225 is non-conductive.

In some embodiments, including a hysteresis stage with both a differential pair of P-type transistors 225 and 227 and a differential pair of N-type transistors 223 and 229 may enable a hysteresis stage to provide hysteresis for the output 118 of cascode stage 107 over a wider range of common mode voltage values between VDD and VSS. In one embodiment, the differential pair of P-type transistors 225 and 227 provide hysteresis when the common mode voltage is at lower voltage values and differential pair of N-type transistors 223 and 229 provides hysteresis when the common mode voltage is at higher voltage values. However, in other embodiments, a hysteresis stage may include other configurations including having only a differential pair of P-type transistors or a differential pair of N-type transistors.

In the embodiment shown, hysteresis stage 105 also includes transistors 221 and 226 for maintaining the differential voltage threshold switching points for output 118 at a consistent value over a wider range of common mode voltage values. Transistor 221 is part of the circuitry that controls the current being provided to P-type transistors 225 and 227 from VDD and transistor 226 is part of the circuitry that controls the current from differential pair of N-type transistors 223 and 229 to VSS. As the common mode voltage rises, transistor 221 because less conductive to reduce the current through differential pair of P-type transistors 225 and 227. As the common mode voltage falls, transistor 226 becomes less conductive to reduce the current through differential pair of N-type transistors 223 and 229. Other embodiments would not include transistors 221 and 226. Some other embodiments would include circuitry (not shown) to control the conductivity of transistors 219 and 224 that receives as input a common mode voltage signal.

FIG. 3 shows a timing diagram of amplifier 101 during an operation according to one embodiment of the present invention. FIG. 3 shows the voltages of two complementary sine wave signals applied to the inverting input (−) and the non-inverting input (+). However, other types of signals may be applied to the inputs in other embodiments. FIG. 3 also shows output 118 of cascode stage 107 which is responsive to the voltage differential between the inputs and shows the feedback signals (FB, FB*) and the output signals (OUT, OUT*).

As shown in FIG. 3, hysteresis stage 105 provides output 118 with hysteresis between switchovers of magnitude (e.g. point 310) of the input voltages. As shown in FIG. 3, output 118 is designed not to switch states from either VSS to VDD or VDD to VSS until after the difference in the differential voltage of the inputs exceeds a threshold magnitude (labeled "hysteresis magnitude" in FIG. 3) (e.g. at point 311).

In the embodiment of FIG. 3, after the voltage differential of the input signals reaches the hysteresis threshold magnitude (point 311), the voltage of output 118 begins to change states from VSS to VDD. At this time, transistors 223, 229, 225, and 227 of hysteresis stage 105 change conductivity when output 118 crosses the voltage thresholds of inverters 251 and 253 of feedback stage 111 (as reflected by the change in feedback signals FB and FB* at point 311). It has been discovered that this change in conductivity of transistors 223, 229, 225, and 227 creates sudden disruptions in the currents at the nodes (e.g. 246, 244) of cascode stage 107. These disruptions in current generate nonlinearities (303, 305) in the voltage response of output 118 with respect to the voltage differential between the input signals. Note that in FIG. 3, the voltage of output 118 shows a non-linearity 303 with respect the smooth transition of the voltages of the inputs (+) (−) just after point 311. These non-linearities in the voltage response of output 118 may cause duty cycle variation of the output signal of amplifier 101 and in a worse case generate a false edge trigger in downstream devices (e.g. inverter 251). In FIG. 3, oscillations 305 and 307 in signal FB are shown to occur as a result of the non-linearities 303 and 304, respectively, in the signal of output 118.

In order to overcome the effect of the non-linearities in output 118 caused by hysteresis stage 105, amplifier 101 includes a hysteresis inverter 109 whose input is connected to output 118. A hysteresis invertor is an inverter whose voltage thresholds for switching states of its output are different for the condition where its input transitions from a low voltage to high voltage from the condition where its input transitions from a high voltage to low voltage. In the embodiment shown, hysteresis invertor 109 has a rising voltage threshold switching point 313 and a falling voltage threshold switching point 315, which are shown in FIG. 3 on output 118. Output 118 is the input into hysteresis inverter 109. The output of inverter 109 is shown in FIG. 3 as the OUT* signal. As shown in FIG. 3, the output of hysteresis inverter 109 (OUT*) switches states in response to the voltage of output 118 reaching the voltage threshold switching points 313 and 315, depending upon the direction of change of the input voltage (output 118).

In the embodiment shown, the non-linearities 303 and 304 (which are due to hysteresis stage 105) occur at voltages of output 118 that are between the voltage threshold switching points 313 and 315 of hysteresis inverter 109. In some embodiments, setting the voltage threshold switching points of the hysteresis inverter outside of non-linearities of the voltage response of the cascode output may provide for an amplifier whose output is not affected by non-linearities caused by a hysteresis stage of the amplifier. In one embodiment where the difference between VSS and VDD is 1.8 volts, the non-linearities 303 and 304 generally occur around 1.0 volts and 0.8 volts, respectively. The voltage threshold switching points 313 and 315 are set at 1.1 volts and 0.7 volts, respectfully. However, these voltages may be of different values in other embodiments.

In some embodiments, proving an amplifier with a cascode stage, a hysteresis stage, and a hysteresis inverter at the output of the cascode stage may provide for an amplifier that that implements a hysteresis margin of the differential inputs by the hysteresis stage in the cascode stage output where the effect of the non-linearities of the cascode stage output due to the hysteresis stage can be eliminated with the hysteresis inverter. Such a configuration may eliminate the probability of false edges at the amplifier output and reduce duty cycle variation in circuits implementing the amplifier due to the non-linearities.

Figure 4:
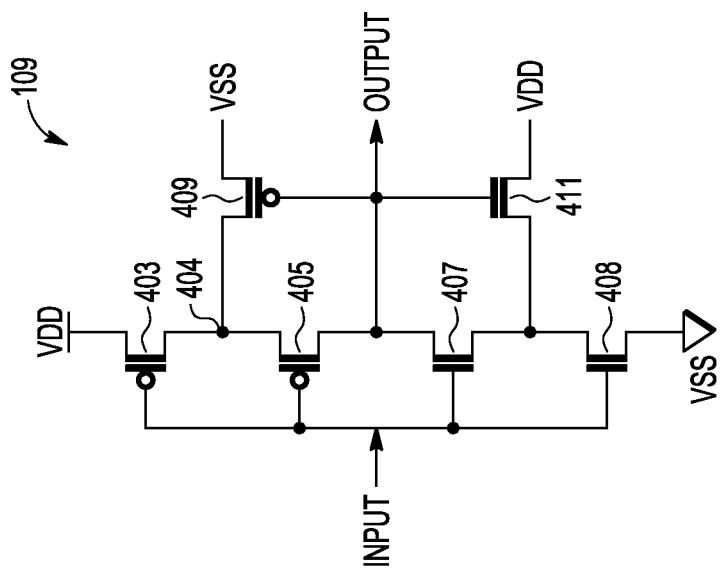
FIG. 4 is a circuit diagram of a hysteresis inverter according to one embodiment of the present invention.

FIG. 4 is a circuit diagram of a hysteresis inverter according to one embodiment of the present invention. In the embodiment shown, hysteresis inverter 109 is characterized as a Schmitt inverter. The embodiment of inverter 109 shown in FIG. 4 includes P-type transistors 403, 405, and 409 and N-type transistors 407, 408, and 411. In the embodiment shown, transistors 409 is weaker (has a lower drive current) than transistors 403 and 405, and transistor 411 is weaker than transistors 407 and 408. In the embodiment shown, the voltage at the gate of transistor 403 has to be low enough to make transistor 403 sufficiently conductive to overcome a conductive transistor 409 to pull the voltage of node 404 to VDD to change the output to a high voltage state from a low voltage state. Likewise, the voltage at the gate of transistor 408 has to be high enough to make transistor 408 sufficiently conductive to overcome conductive transistor 411 to make the output change to a low voltage state from a high voltage state.

Figure 5:
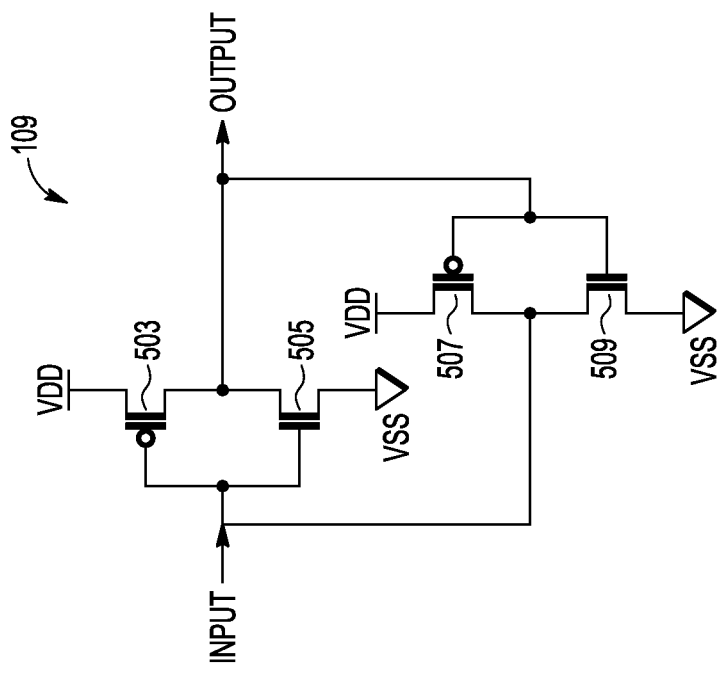
FIG. 5 is a circuit diagram of a hysteresis inverter according to another embodiment of the present invention.

FIG. 5 is a circuit diagram of a hysteresis inverter 109 according to another embodiment of the present invention. Inverter 109 includes P-type transistors 503 and 507 and N-type transistors 505 and 509. Transistors 507 and 509 are weaker than transistors 503 and 505, respectively. When the input changes from a low to high voltage, the voltage signal at the input has to have a sufficient drive strength to overcome weak transistor 509 pulling the input to ground. When the input changes from a high voltage to a low voltage, the signal at the input has to have a sufficient drive strength to overcome transistor 507 pulling the input to VDD. Other types of hysteresis inverters may be used in other embodiments.

Although amplifier 101 is shown being implemented with field effect transistors, at least some of the circuitry may be implemented with other types of transistors in other embodiments. A gate is a control electrode for a field effect transistor. A source and a drain are current electrodes of a field effect transistor.

In one embodiment, an amplifier includes a differential input stage including a non-inverting input and an inverting input, a hysteresis stage coupled to the differential input stage, and a cascode stage coupled to the hysteresis stage. The hysteresis stage is configured to provide hysteresis to an output of the cascode stage. The amplifier includes a feedback stage coupled to the output of the cascode stage and configured to provide a feedback signal to the hysteresis stage. The amplifier includes an output stage coupled to the output of the cascode stage. The output stage includes an amplifier output. The output stage includes a hysteresis inverter coupled between the output of the cascode stage and the amplifier output.

In another embodiment, an amplifier includes an output stage configured to provide an amplifier output and an input stage having a differential pair of transistors. A control electrode of a first transistor of the differential pair is coupled to a non-inverting input of the amplifier and a control electrode of a second transistor is coupled to an inverting input of the amplifier. The amplifier output switches states in response to a voltage differential between the inverting input and the non-inverting input. The amplifier includes a hysteresis stage coupled to the input stage and a cascode stage coupled to the hysteresis stage. The hysteresis stage is configured to provide hysteresis to an output of the cascode stage. The output stage is coupled to the output of the cascode stage and includes a hysteresis inverter coupled between the output of the cascode stage and the amplifier output. The amplifier includes a feedback stage coupled to the output of the cascode stage and configured to provide a first feedback signal and a second feedback signal to the hysteresis stage.

In another embodiment, an amplifier includes an input stage including a first differential pair of transistors of a first conductivity type. A control electrode of a first transistor of the first differential pair is coupled to a non-inverting input and a control electrode of a second transistor is coupled to an inverting input. An amplifier output switches in response to a voltage differential between inverting input and non-inverting input. The input stage includes a second differential pair of transistors of a second conductivity type. A control electrode of a first transistor of the second differential pair is coupled to the non-inverting input and a control electrode of a second transistor of the second differential pair is coupled to the inverting input. The amplifier includes a hysteresis stage coupled to the input stage. The hysteresis stage includes a third differential pair of transistors of the first conductivity type. A control electrode of a first transistor of the third differential pair is coupled to receive a first feedback signal and a control electrode of a second transistor of the third differential pair is coupled to receive a second feedback signal. The hysteresis stage includes a fourth differential pair of transistors of the second conductivity type. A control electrode of a first transistor of the fourth differential pair is coupled to receive the first feedback signal and a control electrode of a second transistor for the fourth differential pair is coupled to receive the second feedback signal. The transistor includes a cascode stage coupled to the hysteresis stage. The hysteresis stage is configured to provide hysteresis to an output of the cascode stage. The first transistor of the first differential pair is configured to control a first current at a first node of the cascode stage, and the second transistor of the first differential pair is configured to control a second current at a second node of the cascode stage. The first transistor of the second differential pair is configured to control a third current at a third node of the cascode stage, and the second transistor of the second differential pair is configured to control a fourth current at a fourth node of the cascode stage. The first transistor of the third differential pair is configured to control a first boost current at the first node of the cascode stage, and the second transistor of the third differential pair is configured to control a second boost current at the second node of the cascode stage. The first transistor of the fourth differential pair is configured to control a third boost current at the third node of the cascode stage, and the second transistor of the fourth differential pair is configured to control a fourth boost current at the fourth node of the cascode stage. The first boost current, the second boost current, the third boost current, and the fourth boost current cause non-linearities in a voltage response of the output of the cascode stage with respect to a voltage differential between the inverting input and the non-inverting input. The amplifier includes a feedback stage coupled to an output of the cascode stage and configured to provide a first feedback signal and a second feedback signal to the hysteresis stage. The amplifier includes an output stage coupled to the output of the cascode stage. The output stage includes the amplifier output. The output stage includes a hysteresis inverter coupled between the output of the cascode stage and the amplifier output.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An amplifier comprising:
    a differential input stage including a non-inverting input and an inverting input;
    a hysteresis stage coupled to the differential input stage;
    a cascode stage coupled to the hysteresis stage, wherein the hysteresis stage is configured to provide hysteresis to an output of the cascode stage;
    a feedback stage coupled to the output of the cascode stage and configured to provide a feedback signal to the hysteresis stage; and
    an output stage coupled to the output of the cascode stage, the output stage including an amplifier output, wherein the output stage includes a hysteresis inverter coupled between the output of the cascode stage and the amplifier output;
    wherein the hysteresis stage further comprises:
        a pair of differential transistors including:
            a first transistor including a control electrode coupled to receive the feedback signal; and
            a second transistor including a control electrode coupled to receive a second feedback signal from the feedback stage;
        wherein the first transistor is configured to control a current at a first node of the cascode stage, and the second transistor is configured to control a current at a second node of the cascode stage, wherein the hysteresis provided by the hysteresis stage is dependent upon the current at the first node and the current at the second node;
    wherein the amplifier further comprises a current control circuit coupled between a supply terminal and the pair of differential transistors to control current between the pair of differential transistors and the supply terminal, the current control circuit including an input coupled to a node configured to provide a common mode voltage of the inverting input and the non-inverting input.

2. The amplifier of claim 1 wherein the hysteresis stage causes a non-linearity in a voltage response at the output of the cascode stage with respect to a voltage differential between the inverting input and the non-inverting input.

3. The amplifier of claim 2 wherein the hysteresis inverter includes a first voltage threshold switching point and a second voltage threshold switching point that is different from the first voltage threshold switching point, wherein the non-linearity in the voltage response of the output of the cascode stage is located between the first voltage threshold switching point and a second voltage threshold switching point.

4. The amplifier of claim 1, wherein the hysteresis inverter of the output stage comprises:
    a Schmitt inverter having an input coupled to the output of the cascode stage.

5. The amplifier of claim 1, wherein the output stage further comprises an inverter having an input coupled to an output of the hysteresis inverter, and an output to provide the amplifier output.

6. An amplifier comprising:
a differential input stage including a non-inverting input and an inverting input;
a hysteresis stage coupled to the differential input stage;
a cascode stage coupled to the hysteresis stage, wherein the hysteresis stage is configured to provide hysteresis to an output of the cascode stage;
a feedback stage coupled to the output of the cascode stage and configured to provide a feedback signal to the hysteresis stage; and
an output stage coupled to the output of the cascode stage, the output stage including an amplifier output, wherein the output stage includes a hysteresis inverter coupled between the output of the cascode stage and the amplifier output;
wherein the hysteresis inverter of the output stage comprises:
  a first transistor of a first conductivity type and a second transistor of a second conductivity type opposite the first conductivity type, the first transistor and the second transistor each include a control electrode connected to an input of the hysteresis inverter and a current electrode connected to an output of the hysteresis inverter;
  a third transistor of the first conductivity type and a fourth transistor of the second conductivity type, the third transistor and the fourth transistor each include a control electrode connected to the output of the hysteresis inverter and a current electrode connected to an input of the hysteresis inverter;
  wherein the third transistor is characterized as being weaker than the first transistor and the fourth transistor is characterized as being weaker than the second transistor.

7. The amplifier of claim 1, wherein the feedback stage comprises a first inverter and a second inverter coupled in series, wherein an output of the first inverter provides the feedback signal to the hysteresis stage and an output of the second inverter provides a second feedback signal to the hysteresis stage, wherein the input of the first invertor and the input of the hysteresis inverter are connected together.

8. The amplifier of claim 6, wherein the hysteresis stage further comprises:
a pair of differential transistors including:
  a first transistor including a control electrode coupled to receive the feedback signal; and
  a second transistor including a control electrode coupled to receive a second feedback signal from the feedback stage;
wherein the first transistor of the pair of differential transistors is configured to control a current at a first node of the cascode stage, and the second transistor of the pair of differential transistors is configured to control a current at a second node of the cascode stage, wherein the hysteresis provided by the hysteresis stage is dependent upon the current at the first node and the current at the second node.

9. The amplifier of claim 1, further comprising:
a first current control device coupled between a supply terminal and the pair of differential transistors to allow a current between the pair of differential transistors and the supply terminal;
a second current control device coupled between a supply terminal and a second pair of differential transistors of the differential input stage to allow a current between the second pair of differential transistors and the supply terminal, a third transistor of the second pair of differential transistors includes control electrode coupled to the inverting input, a fourth transistor of the second pair of differential transistors includes control electrode coupled to the non-inverting input;
wherein the first current control device is configured to allow a fraction of the current that the second current control device is configured to allow.

10. The amplifier of claim 9 wherein
the current control device is coupled in series with the first current control device between the supply terminal and the pair of differential transistors, the control electrode of the current control device is coupled to the node configured to provide a common mode voltage of the inverting input and the non-inverting input.

11. The amplifier of claim 8 further comprising:
a current control circuit coupled between a supply terminal and the pair of differential transistors to control current between the pair of differential transistors and the supply terminal, the current control circuit including an input coupled to a node configured to provide a common mode voltage of the inverting input and the non-inverting input.

12. An amplifier comprising:
an output stage configured to provide an amplifier output;
an input stage having a differential pair of transistors, wherein a control electrode of a first transistor of the differential pair is coupled to a non-inverting input of the amplifier and a control electrode of a second transistor is coupled to an inverting input of the amplifier, wherein the amplifier output switches states in response to a voltage differential between the inverting input and the non-inverting input;
a hysteresis stage coupled to the input stage;
a cascode stage coupled to the hysteresis stage, wherein the hysteresis stage is configured to provide hysteresis to an output of the cascode stage, wherein the output stage is coupled to the output of the cascode stage and includes a hysteresis inverter coupled between the output of the cascode stage and the amplifier output; and
a feedback stage coupled to the output of the cascode stage and configured to provide a first feedback signal and a second feedback signal to the hysteresis stage;
wherein the hysteresis stage further comprises:
  a second pair of differential transistors including:
    a third transistor including a control electrode coupled to receive the first feedback signal; and
    a fourth transistor including a control electrode coupled to receive the second feedback signal;
wherein the first transistor is configured to control a first current at a first node of the cascode stage, and the second transistor is configured to control a second current at a second node of the cascode stage,
wherein the third transistor is configured to control a third current at the first node of the cascode stage, and the fourth transistor is configured to control a fourth current at the second node of the cascode stage;
wherein the hysteresis provided by the hysteresis stage is dependent upon the third current at the first node and the fourth current at the second node;
wherein the amplifier further comprises a current control circuit coupled between a supply terminal and the second pair of differential transistors to control current between the second pair of differential transistors and the supply terminal, the current control circuit including an input coupled to a node configured to provide a common mode voltage of the inverting input and the non-inverting input.

13. The amplifier of claim 12 wherein the hysteresis stage causes a non-linearity in a voltage response at the output of the cascode stage with respect to a voltage differential between the inverting input and the non-inverting input.

14. The amplifier of claim 13 wherein the hysteresis inverter includes a first voltage threshold switching point and a second voltage threshold switching point that is different from the first voltage threshold switching point, wherein the non-linearity in the voltage response of the output of the cascode stage is located between the first voltage threshold switching point and a second voltage threshold switching point.

15. The amplifier of claim 12 wherein a combined magnitude of the first current at the first node and the second current at the second node is greater than the combined magnitude of the third current at the first node and the fourth current at the second node.

16. The amplifier of claim 12, wherein the hysteresis inverter of the output stage comprises:
a Schmitt inverter having an input coupled to the output of the cascode stage.

17. An amplifier comprising:
an output stage configured to provide an amplifier output;
an input stage having a differential pair of transistors, wherein a control electrode of a first transistor of the differential pair is coupled to a non-inverting input of the amplifier and a control electrode of a second transistor is coupled to an inverting input of the amplifier, wherein the amplifier output switches states in response to a voltage differential between the inverting input and the non-inverting input;
a hysteresis stage coupled to the input stage;
a cascode stage coupled to the hysteresis stage, wherein the hysteresis stage is configured to provide hysteresis to an output of the cascode stage, wherein the output stage is coupled to the output of the cascode stage and includes a hysteresis inverter coupled between the output of the cascode stage and the amplifier output; and
a feedback stage coupled to the output of the cascode stage and configured to provide a first feedback signal and a second feedback signal to the hysteresis stage;
wherein the hysteresis inverter of the output stage comprises:

a third transistor of a first conductivity type and a fourth transistor of a second conductivity type opposite the first conductivity type, the third transistor and the fourth transistor each include a control electrode connected to an input of the hysteresis inverter and a current electrode connected to an output of the hysteresis inverter;
a fifth transistor of the first conductivity type and a sixth transistor of the second conductivity type, the fifth transistor and the sixth transistor each include a control electrode connected to the output of the hysteresis inverter and a current electrode connected to an input of the hysteresis inverter;
wherein the fifth transistor is characterized as being weaker than the third transistor and the sixth transistor is characterized as being weaker than the fourth transistor.

18. The amplifier of claim 17, wherein the hysteresis stage further comprises:
a second pair of differential transistors including:
a third transistor including a control electrode coupled to receive the first feedback signal; and
a fourth transistor including a control electrode coupled to receive the second feedback signal;
wherein the first transistor is configured to control a first current at a first node of the cascode stage, and the second transistor is configured to control a second current at a second node of the cascode stage,
wherein the third transistor of the second pair of differential transistors is configured to control a third current at the first node of the cascode stage, and the fourth transistor of the second pair of differential transistors is configured to control a fourth current at the second node of the cascode stage;
wherein the hysteresis provided by the hysteresis stage is dependent upon the third current at the first node and the fourth current at the second node.

19. The amplifier of claim 18 further comprising:
a current control circuit coupled between a supply terminal and the second pair of differential transistors to control current between the second pair of differential transistors and the supply terminal, the current control circuit including an input coupled to a node configured to provide a common mode voltage of the inverting input and the non-inverting input.

* * * * *